US009541583B2

(12) United States Patent
Singh et al.

(10) Patent No.: US 9,541,583 B2
(45) Date of Patent: Jan. 10, 2017

(54) VOLTAGE DETECTOR WITH HIGH VOLTAGE PROTECTION

(71) Applicants: Harmander Singh, Austin, TX (US); Mohammad Mehedi Hasan, Austin, TX (US); Abhiman Pratap Kotwal, Austin, TX (US); Gianfranco Gerosa, Austin, TX (US); Mohammed Hasan Taufique, Austin, TX (US)

(72) Inventors: Harmander Singh, Austin, TX (US); Mohammad Mehedi Hasan, Austin, TX (US); Abhiman Pratap Kotwal, Austin, TX (US); Gianfranco Gerosa, Austin, TX (US); Mohammed Hasan Taufique, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 48 days.

(21) Appl. No.: 13/976,387

(22) PCT Filed: May 8, 2013

(86) PCT No.: PCT/US2013/040209
§ 371 (c)(1),
(2) Date: Jun. 26, 2013

(87) PCT Pub. No.: WO2014/182300
PCT Pub. Date: Nov. 13, 2014

(65) Prior Publication Data
US 2014/0334049 A1 Nov. 13, 2014

(51) Int. Cl.
*H02H 3/20* (2006.01)
*H02H 9/04* (2006.01)
(Continued)

(52) U.S. Cl.
CPC ............ *G01R 19/165* (2013.01); *G11C 5/143* (2013.01); *G11C 7/04* (2013.01); *G11C 7/24* (2013.01); *H01L 27/0248* (2013.01); *G11C 16/22* (2013.01)

(58) Field of Classification Search
CPC ... H02H 1/0007; H01L 27/0248; G11C 5/143; G11C 16/22
(Continued)

(56) References Cited

U.S. PATENT DOCUMENTS 5,392,186 A 2/1995 Alexander et al.
6,433,616 B1 * 8/2002 Dishongh et al. ............ 327/525
(Continued)

FOREIGN PATENT DOCUMENTS

RU 2375802 12/2009

OTHER PUBLICATIONS

Notification of Transmittal of the International Search Report and the Written Opinion of the International Searching Authority issued for International Patent Application No. PCT/US2013/040209, mailed Dec. 26, 2013, 6 pages.
(Continued)

*Primary Examiner* — Thienvu Tran
*Assistant Examiner* — Lucy Thomas
(74) *Attorney, Agent, or Firm* — Blakely, Sokoloff, Taylor & Zafman LLP

(57) ABSTRACT

Described is an apparatus comprising: a voltage level detector to monitor a first power supply node; and a voltage level protector, coupled to the voltage level detector, to protect the voltage level detector from receiving a power supply on the first power supply node above a pre-defined threshold voltage. Described is also a voltage level protector to protect a first power supply node from receiving a power supply above a pre-defined threshold voltage, the voltage level protector comprising: a first p-type device coupled to a second power supply node, the second power supply node to
(Continued)

receive a power supply higher than the power supply on the first power supply node; and a second p-type device coupled in series to the first p-type device, the second p-type further coupled to the first power supply node, which is for coupling to a voltage level detector.

18 Claims, 7 Drawing Sheets

(51) Int. Cl.
| | | |
|---|---|---|
| *G01R 19/165* | (2006.01) | |
| *G11C 7/04* | (2006.01) | |
| *G11C 7/24* | (2006.01) | |
| *G11C 5/14* | (2006.01) | |
| *H01L 27/02* | (2006.01) | |
| *H02H 9/00* | (2006.01) | |
| *H02H 3/22* | (2006.01) | |
| *G11C 16/22* | (2006.01) | |

(58) Field of Classification Search
USPC .......................... 361/111, 56, 91, 91.1, 91.5
See application file for complete search history.

(56) References Cited

U.S. PATENT DOCUMENTS

| | | | |
|---|---|---|---|
| 7,621,671 B2* | 11/2009 | Petruzzi | H01L 23/34 |
| | | | 374/170 |
| 8,059,375 B2* | 11/2011 | Fehle et al. | 361/56 |
| 8,077,157 B2* | 12/2011 | Sengupta et al. | 345/173 |
| 8,102,632 B2* | 1/2012 | Liang et al. | 361/56 |
| 2004/0223375 A1 | 11/2004 | Annavajjhala | |
| 2011/0134577 A1 | 6/2011 | Skarp | |

OTHER PUBLICATIONS

PCT International Preliminary Report and the Written Opinion for International Patent Application No. PCT/US2013/040209, mailed Nov. 10, 2015, 12 pages.

Notification of Transmittal of the International Search Report and the Written Opinion of the International Searching Authority issued for International Patent Application No. PCT/US2013/040209, mailed Nov. 19, 2015, 13 pages.

* cited by examiner

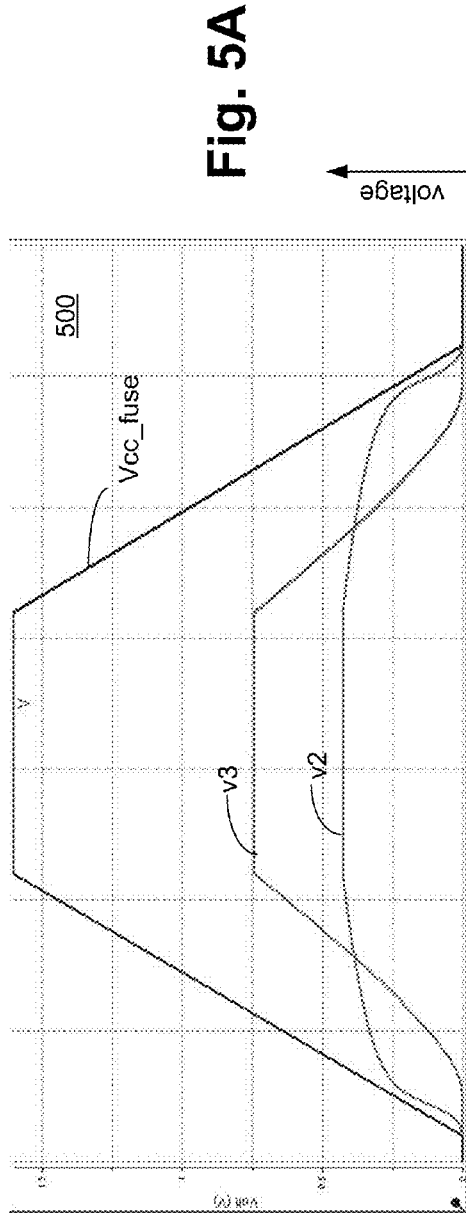
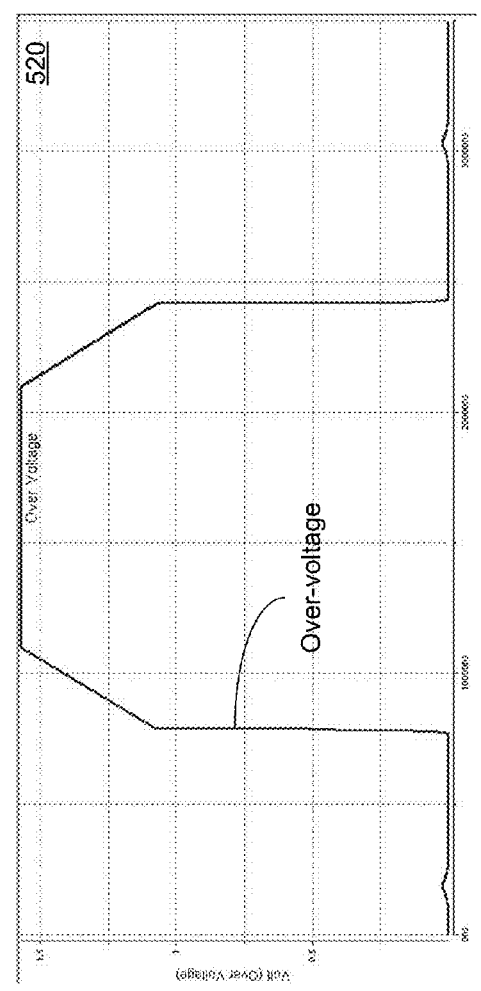

VOLTAGE DETECTOR WITH HIGH VOLTAGE PROTECTION

CLAIM OF PRIORITY

This application claims the benefit of priority of International Patent Application No. PCT/US2013/040209 filed May 8, 2013, titled "VOLTAGE DETECTOR WITH HIGH VOLTAGE PROTECTION," which is incorporated by reference in its entirety.

BACKGROUND

One-time programmable fuse arrays, for example, programmable read-only memories (PROMs), store various values in a Central Processing Unit (CPU) or System-on-a-chip (SoC). These stored values (also called fuse values) may relate to security keys, activation of various CPU/SoC features and functions such as cache memory size, etc. These fuse values are programmed using ultra high voltages (typically >2.2V), where the CPU may operate on a much lower voltage (e.g., 1.0V). In-Field-Programmable (IFP) fuse arrays are one-time programmable fuses that are also used for storing customer specific data (i.e., fuse values). A primary use for these IFP fuse arrays is to store specific security keys which phone devices use to function on their mobile carriers' network as well as for storing data which enables or disables any of the various functions and features of the SoC platform.

Manipulating such fuse values can unlock various features in a chip undesirably by overriding fuse values or customer security keys. One way of unlocking a processor (e.g., CPU) by disrupting fuse values is through voltage level manipulation. Voltages may be supplied from a motherboard, outside of the die and package, and are thus susceptible to manipulation through physical access of voltage pins. Changing supply voltages affects how much current can flow through a primary fuse cell as well as the reference fuse cell (which is used to develop the voltage differential at Sense Amplifier inputs), and also affect the sensing clock which controls how long the sense amplifier is enabled. This distorts the current values fed into the fuse sense amplifier as well as reduces the time required to develop the sense amplifier differential, which in turn corrupts the fuse values that are being read out.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIGS. 5A-B are plots with waveforms showing over-voltage protection operation, according to one embodiment of the disclosure.

DETAILED DESCRIPTION

Figure 1:
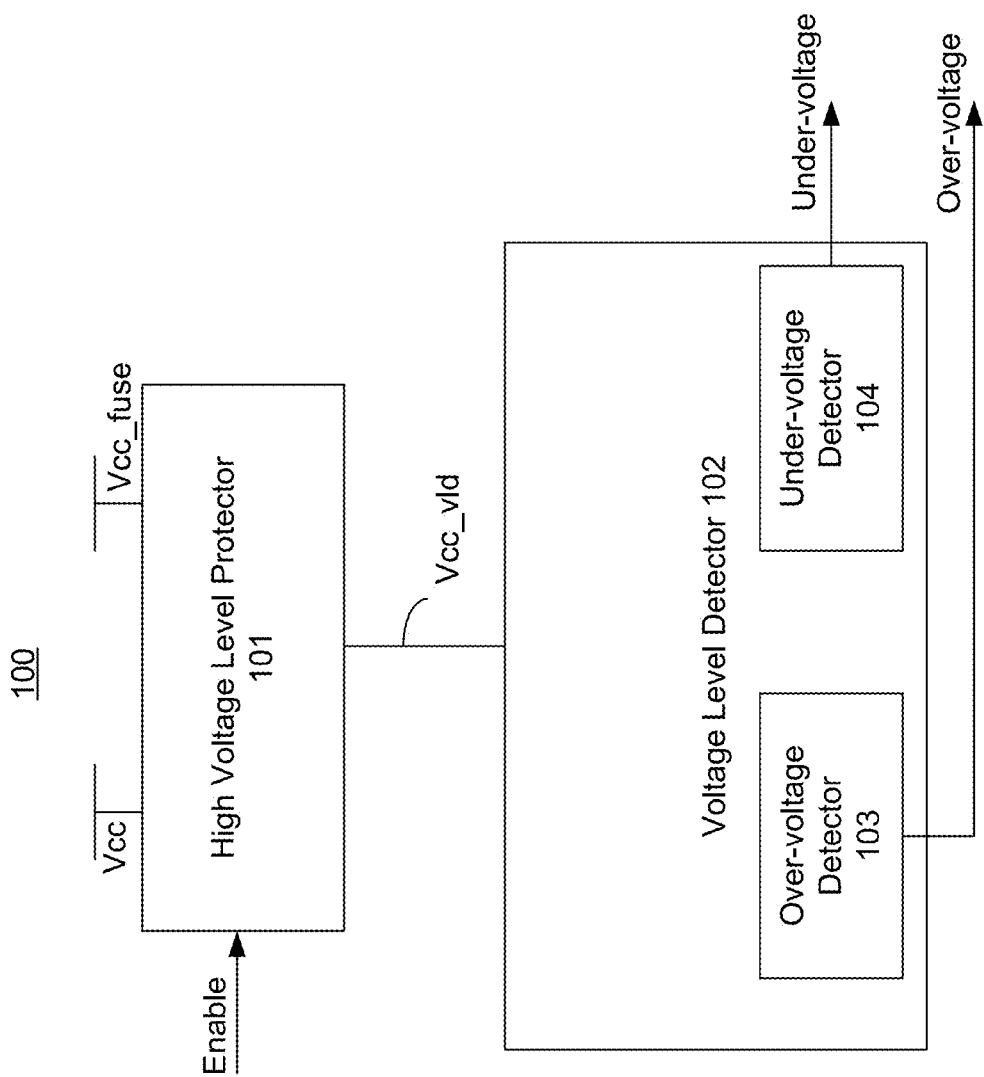
FIG. 1 is high level architecture of a voltage level detecting (VLD) circuit with high voltage protector, according to one embodiment of the disclosure.

The embodiments describe a protection scheme which detects voltage level on-die, can shutdown fuse array functionality, and can lock out reading of the fuse values if any manipulation on the input supply rails is detected. Since the manipulation of the input supply rails can be either higher or lower than the nominal voltage, the embodiments protect against over-voltage and under-voltage supply manipulation. The embodiments also describe a high voltage level protection circuitry to protect voltage level detection (VLD) circuit. In one embodiment, the high voltage level protection circuitry can withstand greater than 2.2V (or any other high voltage) applied during fuse programming so that the VLD circuit itself is not damaged due to voltage overstress. The embodiments simultaneously detect and protect over-voltage and under-voltage supply rail manipulation, while insulating internal transistors from ultra-high voltage overstress (e.g., greater than 2.2V) during fuse programming.

In the following description, numerous details are discussed to provide a more thorough explanation of the embodiments of the present disclosure. It will be apparent, however, to one skilled in the art, that the embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediate devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a," "an," and "the" include plural references. The meaning of "in" includes "in" and "on."

The term "scaling" generally refers to converting a design (schematic and layout) from one process technology to another process technology. The term "scaling" generally also refers to downsizing layout and devices within the same technology node. The terms "substantially," "close," "approximately," "near," "about," etc., generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. The transistors also include Tri-Gate and FinFet transistors. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 1 is high level architecture 100 of a voltage level detecting (VLD) circuit with high voltage protection, according to one embodiment of the disclosure. In one embodiment, architecture 100 comprises a High Voltage Level Protector 101 coupled to a Voltage Level Detector (VLD) 102. In one embodiment, high voltage level protector 101 receives nominal voltage supply Vcc and may also receive a different power supply (i.e., higher or lower voltage level than nominal voltage supply Vcc). For example, High Voltage Level Protector 101 may receive Vcc_fuse (e.g., 2.2V or higher) at one of its power supply nodes used for programming fuse cells. In one embodiment, if fuse programming is enabled via the Enable signal, and Vcc_fuse is set to a high voltage (e.g., 2.2V) then High Voltage Level Protector 101 ensures that its output, Vcc_vld, is near nomial voltage level (e.g., Vcc or below) so that circuits of VLD 102 are not compromised (i.e., not destroyed).

In one embodiment, VLD 102 comprises Over-voltage Detector 103 and Under-voltage Detector 104. In one embodiment, Over-voltage Detector 103 detects whether Vcc_vld is above a threshold voltage. In one embodiment, if it is determined that Vcc_vld is above a threshold voltage, then Over-voltage signal is asserted. In one embodiment, Under-voltage Detector 104 detects whether Vcc_vld is below a threshold voltage. In one embodiment, if it is determined that Vcc_vld is below a threshold voltage, then Under-voltage signal is asserted. In one embodiment, another logic unit (not shown) monitors the Over-voltage and Under-voltage signals to determine whether voltage on Vcc_fuse has been manipulated when fuse programming is disabled and fuse sensing is enabled. In one embodiment, when fuse programming is enabled via the Enable signal, then high Voltage Level Protector 101 prevents Vcc_fuse from propagating voltages greater than approximately 1.05V to Vcc_vld.

Figure 2:
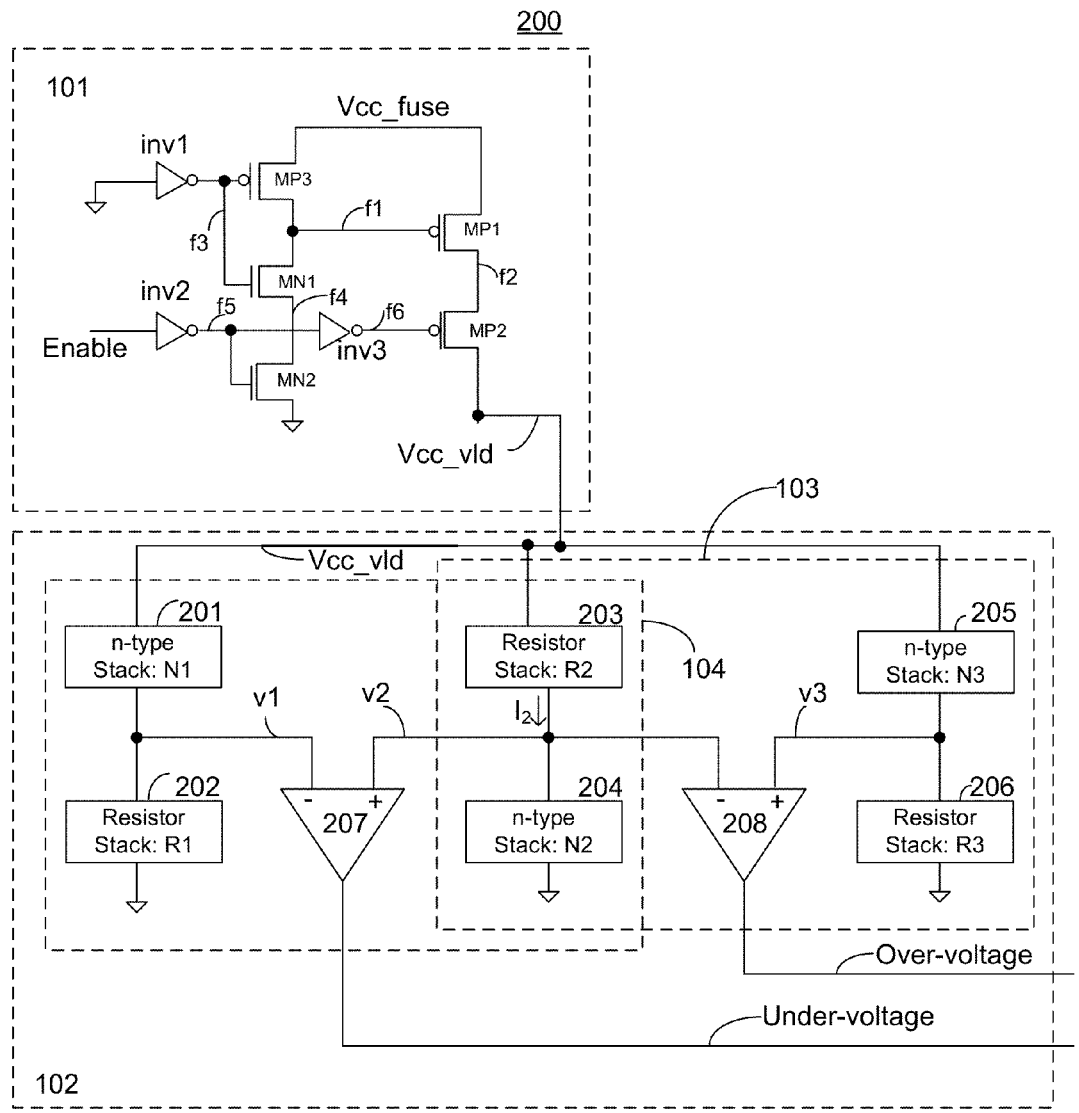
FIG. 2 is circuit level architecture of the VLD circuit with high voltage protector, according to one embodiment of the disclosure.

FIG. 2 is circuit level architecture of the VLD circuit with high voltage protection, according to one embodiment of the disclosure. It is pointed out that those elements of FIG. 2 having the same reference numbers (or names) as the elements of any other figure can operate or function in any manner similar to that described, but are not limited to such.

In one embodiment, High Voltage Level Protector 101 comprises: first p-type device MP1, second p-type device MP2, third p-type device MP3, first n-type device MN1, second n-type device MN2, first inverter inv1, second inverter inv2, and third inverter inv3. In one embodiment, source terminal of MP1 is coupled to Vcc_fuse while drain terminal (same as node f2) of MP1 is coupled to source terminal (same as node f2) of MP2. In one embodiment, MP3 is coupled in series with MN1 such that the shared node f1 is used to control the gate terminal of MP1. In one embodiment, gate terminals of MN1 and MP3 are coupled together as shown by node f3.

In one embodiment, MN1 is coupled in series with MN2 such that the shared node f4 is coupled to source terminal of MN1 and drain terminal of MN2. In this embodiment, source terminal of MN2 is coupled to ground. In one embodiment, gate terminals of MP3 and MN1 are tied to nominal power supply Vcc (e.g., 1.1V). In one embodiment, inverter inv1 is used to drive the gate terminals of MP3 and MN1, where inv1 operates using nominal power supply Vcc (e.g., 1.1V) and input of inverter inv1 is tied to ground.

In one embodiment, Enable signal is received by High Voltage Level Protector 101. In one embodiment, Enable is inverted by inverter inv2 which drives another inverter inv3 and gate terminal (same as node f5) of MN2. In one embodiment, output of inverter inv3 is used to drive gate terminal (same as node f6) of MP2. In one embodiment, drain terminal of MP2 provides power supply Vcc_vld to VLD 102.

In one embodiment, Under-voltage Detector 104 of VLD 102 comprises a first stack of n-type devices N1 201 (also called left-side n-type stack), first resistor R1 202, second resistor R2 203, second stack of n-type device N2 204 (also called middle n-type stack), and first comparator 207. In one embodiment, first stack of n-type devices N1 201 is coupled in series with first resistor R1 202 such that first stack of n-type devices N1 201 is coupled to Vcc_vld on one end and common node v1 (i.e., common coupling node between first stack of n-type devices N1 201 and first resistor R1 202). In one embodiment, second stack of n-type devices N2 204 is coupled in series with second resistor R2 203 such that second stack of n-type devices N2 204 is coupled to ground on one end and common node v2 (i.e., common coupling node between second stack of n-type devices N2 204 and second resistor R2 203) at another end. In this embodiment, one end of second resistor R2 203 is coupled to Vcc_vld.

In this embodiment, the coupling of first stack of n-type devices N1 201 and first resistor R1 202 forms a voltage divider, where v1 has a voltage level which is divided from Vcc_vld. In one embodiment, the coupling of second stack of n-type devices N2 204 and second resistor R2 203 forms another voltage divider, where node v2 has a voltage level which is divided from Vcc_vld. In one embodiment, first comparator 207 compares voltages of nodes v1 and v2. The term "nodes" and voltages on those nodes is used interchangeably. In one embodiment, node v1 is coupled to negative terminal of first comparator 207 while node v2 is coupled to positive terminal of first comparator 207. In one embodiment, output of first comparator 207 is the Under-voltage signal.

In one embodiment, Over-voltage Detector 103 of VLD 102 comprises a third stack of n-type devices N3 205 (also called right-side n-type stack), third resistor R3 206, second resistor R2 203, second stack of n-type device N2 204, and second comparator 208. In one embodiment, third stack of n-type devices N3 205 is coupled in series with third resistor R3 206 such that third stack of n-type devices N3 205 is coupled to Vcc_vld on one end and common node v3 (i.e., common coupling node between third stack of n-type devices N3 and third resistor R3 206) at another end. In one embodiment, second stack of n-type devices N2 204 is coupled in series with second resistor R2 203 such that second stack of n-type devices N2 204 is coupled to ground on one end and common node v2 (i.e., common coupling node between second stack of n-type devices N2 204 and second resistor R2 203). In this embodiment, one end of second resistor R2 203 is coupled to Vcc_vld.

In this embodiment, the coupling of third stack of n-type devices N3 and third resistor R3 206 forms a voltage divider, where node v3 has a voltage level which is divided from Vcc_vld. In one embodiment, the coupling of second stack of n-type devices N2 204 and second resistor R2 203 forms another voltage divider, where node v2 has a voltage level which is divided from Vcc_vld. In one embodiment, second comparator 208 compares voltages on nodes v2 and v3. In one embodiment, node v2 is coupled to negative terminal of second comparator 208 while node v3 is coupled to positive terminal of second comparator 208. In one embodiment, output of second comparator 208 is the Over-voltage signal.

Figure 3A:
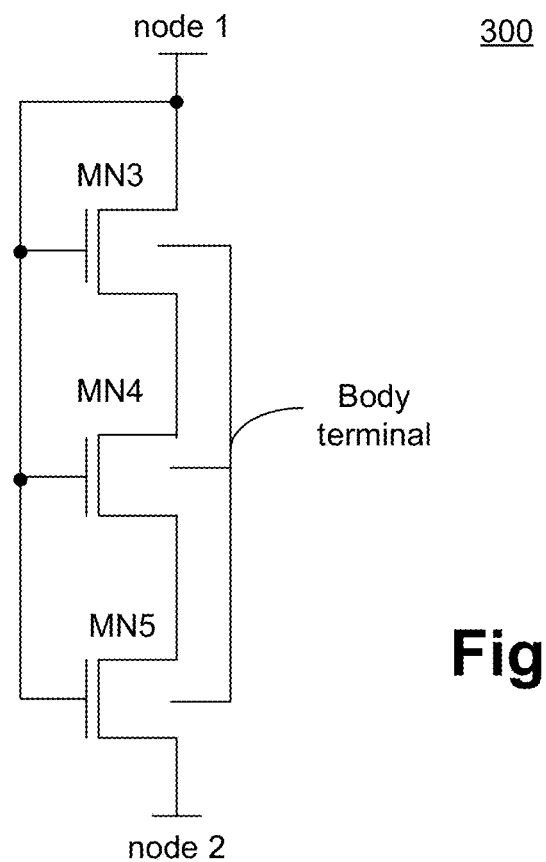
FIGS. 3A-B are components of the VLD circuit, according to one embodiment of the disclosure.

In one embodiment, first, second and third n-type stacks (201, 204 and 205) comprise NMOS devices coupled together in series. One such embodiment of first, second, and third n-type stacks are shown in FIG. 3A. In one embodiment, stack of n-type devices 300 comprises MN3 coupled in series with MN4 which is coupled in series with MN5, where MN3 is coupled to node 1 and MN5 is coupled to node 2. In one embodiment, body terminal of all devices in the stack of devices 300 is tied to ground (Vss). In other embodiments, the body terminal of each device in the stack may be coupled to ground and another voltage terminal to control the resistance of the device. In one embodiment, gate terminals of MN3, MN4, and MN5 are tied together at node 1. In one embodiment, gate terminals of MN3, MN4, and MN5 are tied together to Vcc_vld for first and third stacks 201 and 205, respectively. In one embodiment, gate terminals of MN3, MN4, and MN5 are tied together to node v2 for second stack 204.

While the embodiment of FIG. 3A shows three n-type devices stacked in series, the n-type devices may be stacked in any other order i.e., series and/or parallel or combination of both. In one embodiment, fewer than three or greater than three n-type devices may be used. In one embodiment, n-type devices have variable sizes, where the sizes are varied by turning on/off additional n-type devices coupled in parallel to each of the shown n-type devices or by varying the sizes of individual n-type devices.

Figure 3B:
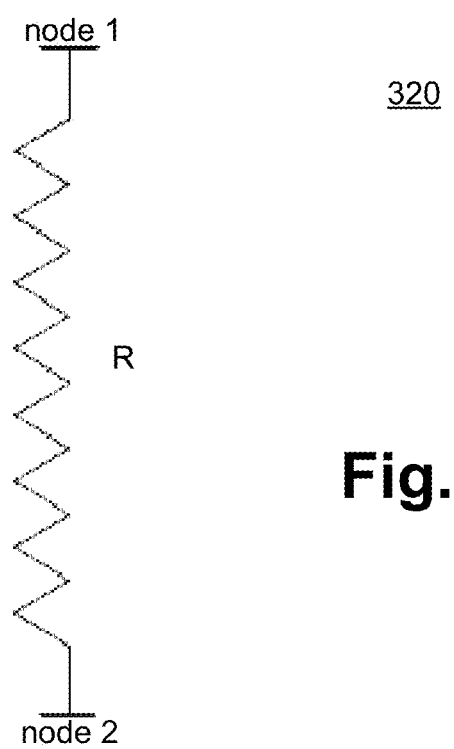

Referring back to FIG. 2, in one embodiment, first, second, and third resistors (202, 203 and 206) comprise CPR (Commercial Power Radial Terminals) type resistors. In other embodiments, any other types of resistors may be used. FIG. 3B shows a resistor 320 with a single resistor coupled between nodes 1 and 2. This resistor can be used for first, second, and third resistors (202, 203 and 206). In one embodiment, the resistance of this resistor about 16 kΩ. In other embodiments, other values of resistance may be used. While the embodiment shows a single resistor, any number of resistors may be used in any combination (i.e., series and/or parallel) to achieve the desired resistance R.

Referring back to FIG. 2, in one embodiment, each of the device stacks has a varying number of n-type devices and device widths, therefore offering varied source-drain resistance ($R_{ds}$) for the overall stack, when fully turned on. There are several advantages to this design. For example, VLD circuit 102 prevents fuses from being sensed during under/over voltage manipulation and the High Voltage Level Protector circuit 101 protects the VLD circuit 102 during fuse programming mode when the applied voltage on Vcc_fuse higher than nominal voltage Vcc (i.e., Vcc_fuse is greater than Vcc e.g., Vcc_fuse is greater than 2.2V).

In one embodiment, VLD circuit 102 comprises three sets of uniquely sized n-type device stacks and three sets of the same resistors (i.e., each of the first, second, and third n-type stacks (201, 204, and 205) have different ON resistances, while first, second, and third resistors (202, 203, and 206) have the same resistances). In one embodiment, n-type devices of 201, 204, and 205 operate in a combination of linear and saturation regions during active function. In one embodiment, n-type devices of 201, 204, and 205 are used as variable resistors, as the source-drain resistances of these n-type devices fall as their gate voltages are raised. In one embodiment, resistors 202, 203, and 206 are constructed with a fixed resistance which is approximately 16 kΩ. With each pair of device/resistor stack, a voltage divider is formed. In this embodiment, VLD circuit 102 has three voltage dividers, with the middle resistor 203 and n-type stack 204 branch shared between the Over-voltage Detector 103 and Under-voltage Detector 104.

In the Under-voltage Detector 104, drain terminal of N1 n-type stack 201 (i.e., node 1 of stack 300) is coupled to the supply voltage (Vcc_vld), which has a nominal functional voltage (e.g. 1.0V or less) when High Voltage Level Protector 101 is enabled during fuse programming. In one embodiment, the source terminal (i.e., node 2 of stack 300) of the N1 n-type stack 201 is coupled to one end of R1 resistor 202 at node v1. The other end of R1 resistor 202 is coupled to ground.

In one embodiment, middle stack (R2 203 and N2 204) is formed in an opposite configuration compared to the left-side stack (N1 201 and R1 202), where resistor R2 203 is coupled between the supply voltage (Vcc_vld) and node v2. In one embodiment, middle n-type stack N2 204 is coupled between node v2 (which becomes the drain voltage of this stack) and ground. The voltages between these stacks (i.e., voltages on nodes v1 and v2) are then fed to a sense amplifier (also called first comparator 207) to magnify the differential of voltages on nodes v1 and v2. In one embodiment, the resulting output (Under-voltage signal) is fed into several stages of digital inverters (not shown) to produce a final digital signal for processing by other logic units (e.g., power control unit).

During SoC boot up process, supply voltage (Vcc_fuse) ramps up (e.g., 0V to 1.0V in sense mode), which causes Vcc_vld to ramp up (e.g., from 0V to approx. 1.0V in sense mode). In this example, the term "sense mode" generally refers to the case when Enable is logical low. As Vcc_vld ramps up, VLD circuit 102 develops a voltage differential between nodes v1 and v2 at inputs of sense amplifier 207. As supply voltage Vcc_vld increases, the source to drain resistances ($R_{ds}$) of the devices (e.g., MN3, MN4, and MN5) in the n-type stack 300 start falling.

For example, left n-type stack 201 has a gate bias equal to Vcc_vld and the middle n-type stack 204 has a gate bias of Vcc_vld−$I_2$×R2, where $I_2$ is the current flowing through resistor R2 104 and the middle n-type stack. As Vcc_vld increases, the source to drain resistances of the n-type stacks (N1 201 and N2 204) tends to approach N1_$R_{ds}$<<N2_$R_{ds}$. In one embodiment, when the resistors are the same (i.e., R1 202=R2 203), the differential voltage developing between nodes v1 and v2 is controlled by the n-type stacks N1 201 and N2 204.

In one embodiment, when potential drop across R1 202 becomes larger than the potential drop across N2_$R_{ds}$ (due to faster falling of N1_$R_{ds}$), the sense amplifier 207 goes from triggered to un-trigger mode. In one embodiment, fixed resistors R1 202 and R2 203 and the number/width of the n-type devices in the left-side 201 and middle 204 stacks are pre-determined through simulation, for example, so that sense amplifier 207 trips at a desired voltage value of Vcc_vld. In one embodiment, this trip point is calibrated to allow for differing minimum Vcc_vld requirements due to process/temperature variation of the burned fuse resistance to ensure security across different skew and temperature corners.

In one embodiment, High Voltage Level Protection circuit 101 is used to protect VLD circuit 102 because VLD circuit 102 is traditionally physically coupled to a fuse array high voltage rail, here Vcc_fuse. During fuse sensing, Vcc_fuse has a nominal voltage, e.g., 1.0V. However, during fuse programming, Vcc_fuse can go as high as, e.g., 2.8V, to successfully program a fuse bit-cell. In one embodiment, during this programming phase of the fuse bit-cell, VLD circuit 102 is not needed. Traditionally, since VLD circuit 102 is on-die in the silicon, there is no physical way to disconnect it from the high voltage rail of Vcc_fuse. In one embodiment, High Voltage Level Protection circuit 101 is designed such that VLD circuit 102 is protected from high voltages during fuse programming phase so that VLD circuit 102 can operate normally during sense mode (i.e., when fuses are being read and/or not being programmed).

Depending upon the process technology, electrical overstress (EOS) limit of devices is the voltage difference across oxide layer of a device which if increased beyond the limit causes the device to breakdown. So as not to obscure the embodiments of the disclosure, Vcc_fuse can be as high as 2.8V and the EOS limit of thick gate devices used in High Voltage Level Protection circuit 101 is 1.89V while EOS limit for standard devices (non-thick gate) is 1.15V. However, depending upon the process technology, different voltage levels for Vcc_fuse and EOS limits may be used. In one embodiment, bias voltage levels to the gate terminals of the devices in High Voltage Level Protection circuit 101 are designed to be such that the maximum voltage across any two terminals of a device is less than 1.89V to satisfy EOS limit rules.

Continuing with the example, when Vcc_fuse is set to a program voltage of 2.8V, High Voltage Level Protection circuit 101 ensures that Vcc_vld node does not increase more than 1.1V (which is close to the EOS limit of the standard devices used in the VLD circuit 102). In one embodiment, when Vcc_fuse is set to a sense mode voltage of 1.0V, Vcc_vld node is maintained within a range (e.g., +/−5%) of 1.0V, which is the normal operating voltage range for VLD circuit 102 and for fuse sensing, in a typical process/temperature corner. In such an embodiment, Enable is set to logical low level.

In one embodiment, during fuse programming phase, Vcc_fuse is raised to a maximum/worst case voltage for programming fuse bit-cells (e.g., 2.8V). In one embodiment, to protect the standard performance devices in VLD circuit 102, High Voltage Level Protection circuit 101 ensures that the node voltage Vcc_vld is not greater than the EOS limit for standard devices (e.g., 1.15V). In one embodiment, each of the thick gate devices (MP1, MP2, MP3, MN1, and MN2) in High Voltage Level Protection circuit 101 has an EOS limit of 1.89V, for example, the drop across any two terminals of all of the devices in High Voltage Level Protection circuit 101 does not exceed this level. In one embodiment, since High Voltage Level Protection circuit 101 does not switch during normal function (the single input signal Enable is set before programming happens and stays constant throughout this mode) all nodal voltages are static.

In one embodiment, during fuse sensing phase Vcc_fuse is set to a nominal voltage for fuse sensing e.g., 1.0V. In this embodiment, High Voltage Level Protection circuit 101 ensures that Vcc_vld be at a voltage range around the nominal voltage for fuse sensing e.g., +/−5% of 1.0V. In one embodiment, devices in High Voltage Level Protection circuit 101 are thick gate devices such that devices MP1 and MP2 are larger in size than devices MP3, MN1 and MN2. In one embodiment, devices MP3, MN1 and MN2 sized near minimum size (i.e., W/L is minimum allowed by the process technology). In one embodiment, inverter inv3 driving node f6 is several times larger than minimum size to be able to sufficiently drive the larger MP2 device. In one embodiment, the other two inverters inv1 and inv2 are close to minimum sized. In one embodiment, all three inverters—inv1, inv2, and inv3—are powered by Vcc (e.g., 1.0V).

Figure 4A:
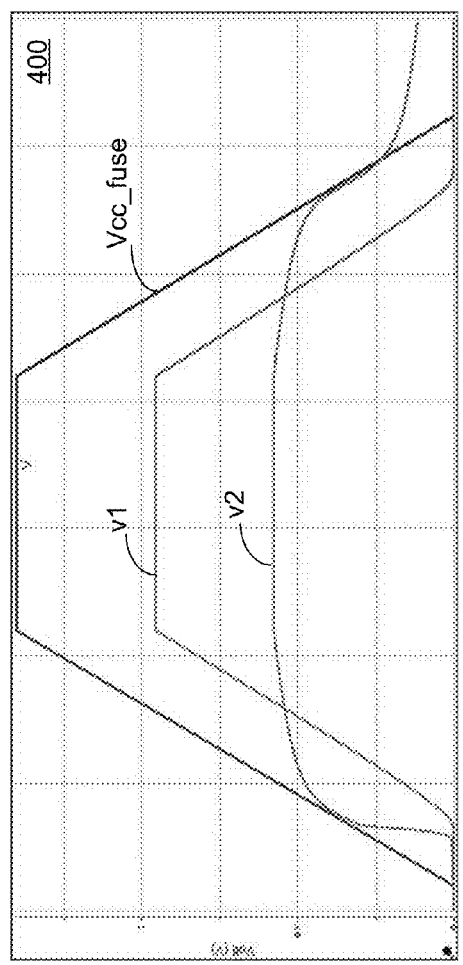
FIGS. 4A-B are plots with waveforms showing under-voltage protection operation, according to one embodiment of the disclosure.
Figure 4B:
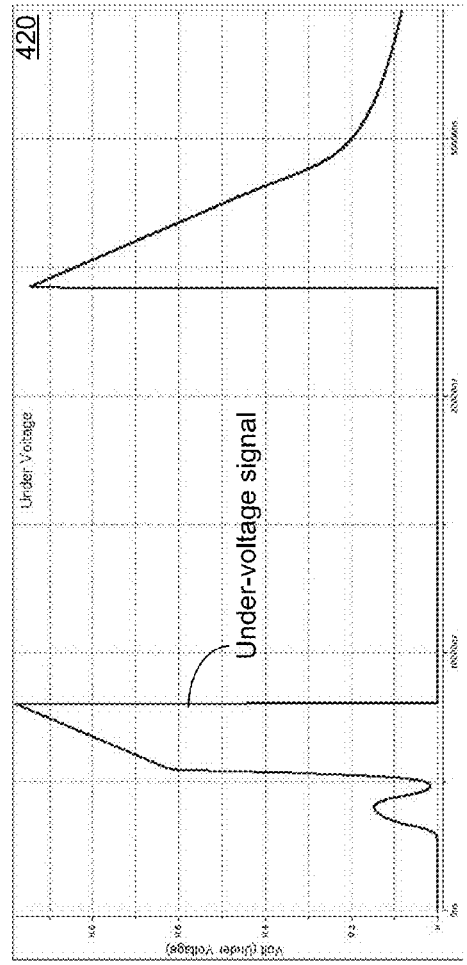

FIGS. 4A-B are waveforms showing under-voltage protection operation, according to one embodiment of the disclosure. It is pointed out that those elements of FIGS. 4A-B having the same reference numbers (or names) as the elements of any other figure can operate or function in any manner similar to that described, but are not limited to such. Here, the x-axis is time and the y-axis is voltage.

FIG. 4A shows a plot 400 with fuse voltage rail (Vcc_fuse) slowly ramping up as well as the two voltage inputs at nodes v1 and v2 to sense amplifier 207. FIG. 4B shows a plot 420 with the Under-voltage signal. In this example, the Under-voltage signal is not de-asserted until voltage on node v1 crosses voltage on node v2, at which point, the supply voltage is enough to sense the fuses and a fuse sense procedure is started. If VLD circuit 102 were not present, the stored fuse values would be read out without reaching the desired supply voltage, thus possibly reading out wrong fuse values. Once the rail ramps up above the voltage specification, the Under-voltage signal is de-asserted.

FIGS. 5A-B are waveforms showing Over-voltage protection operation, according to one embodiment of the disclosure. It is pointed out that those elements of FIGS. 5A-B having the same reference numbers (or names) as the elements of any other figure can operate or function in any manner similar to that described, but are not limited to such. Here, the x-axis is time and the y-axis is voltage.

FIG. 5A shows a plot 500 with fuse voltage rail (Vcc_fuse) slowly ramping up as well as the two voltage inputs v2 and v3 to sense amplifier 208. FIG. 5B shows a plot 520 with Over-voltage signal. In this example, Vcc_fuse rail is ramped above the voltage specification during an attack. Initially, voltage on node v3 is lower than voltage on node v2, indicating that the voltage rail is not above the voltage rail specification, and the Over-voltage signal remains de-asserted. Then, after the voltage rail is ramped high enough, voltage on node v3 rises above voltage on node v2 (i.e., potential drop across R3 206 becomes larger than N2_$R_{ds}$ due to faster falling of N3_$R_{ds}$). In this example, the triggered sense amplifier output is inverted indicating the Over-voltage signal is asserted, signaling an unacceptable voltage level on the fuse sense rail.

Figure 6A:
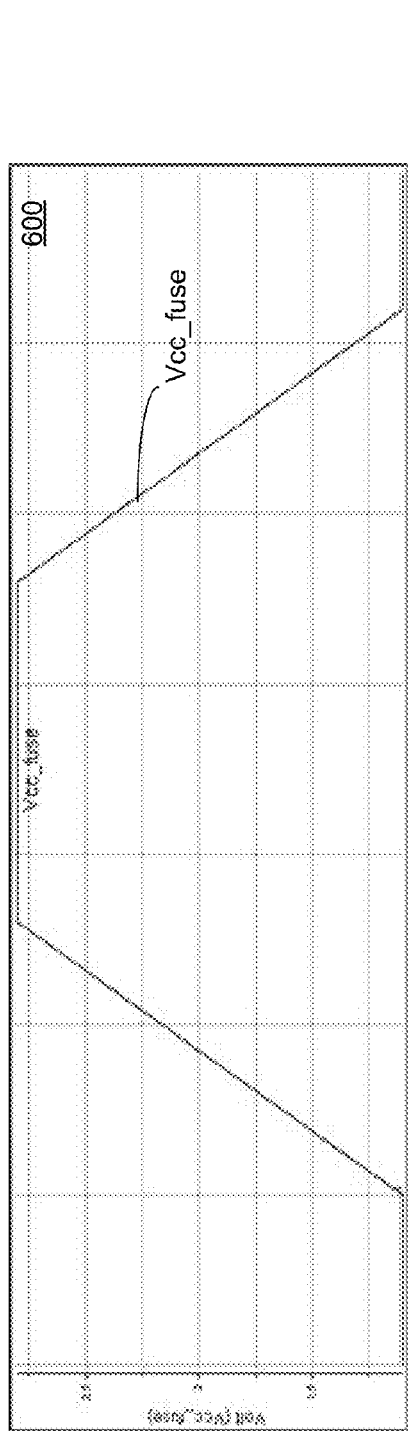
FIGS. 6A-B are plots with waveforms showing operation of VLD during fuse programming, according to one embodiment of the disclosure.
Figure 6B:
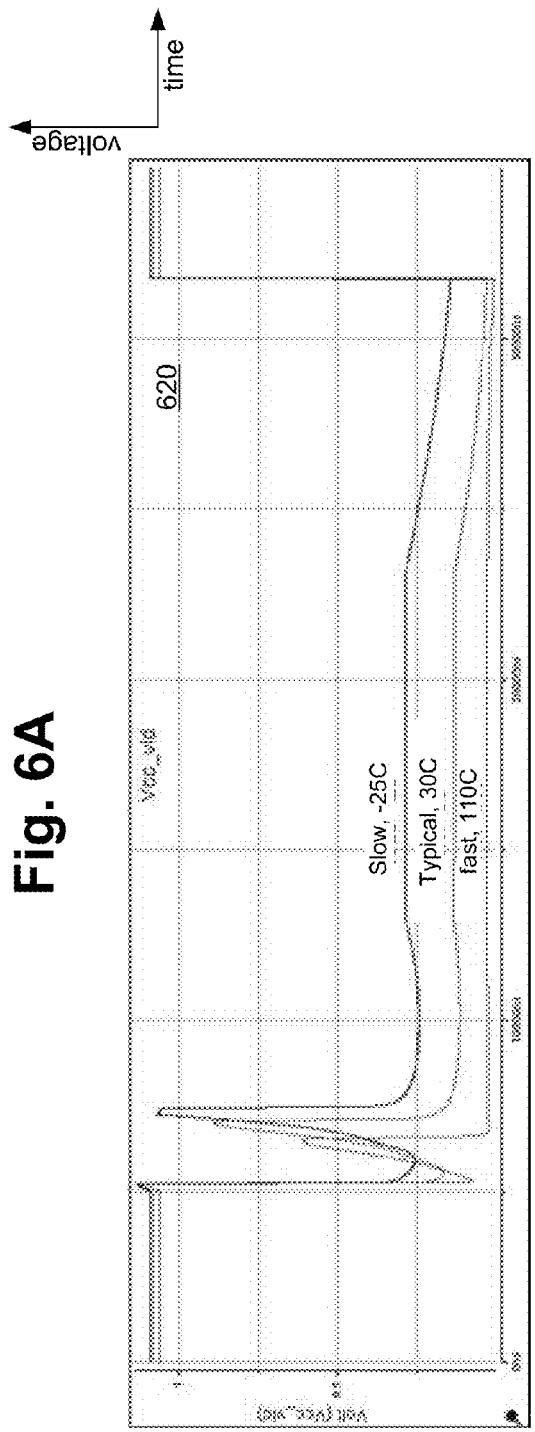

FIGS. 6A-B are waveforms showing operation of VLD during fuse programming, according to one embodiment of the disclosure. It is pointed out that those elements of FIGS. 6A-B having the same reference numbers (or names) as the elements of any other figure can operate or function in any manner similar to that described, but are not limited to such. Here, the x-axis is time and the y-axis is voltage.

FIG. 6A is a plot 600 which shows the waveform of Vcc_fuse when the Enable signal is asserted to indicate the start of the fuse programming mode. FIG. 6B is plot 620 which shows Vcc_vld. After Enable is asserted the Vcc_fuse rail is ramped up from its initial value of 1.0V to a maximum of 2.8V for fuse programming. FIG. 6B shows that Vcc_vld rail goes from 1.0V (before Enable is asserted) to about 50 mV-100 mV (after Enable is asserted) even as the VCC_fuse rail is ramping very high. The glitch seen in FIG. 6B occurs because as Vcc_fuse ramps up there is a finite delay in turning on device MP3 which in turn turns off device MP1. However, the waveform shows that the nodal voltage on Vcc_vld stays well within the expected range during the entire process.

Figure 7:
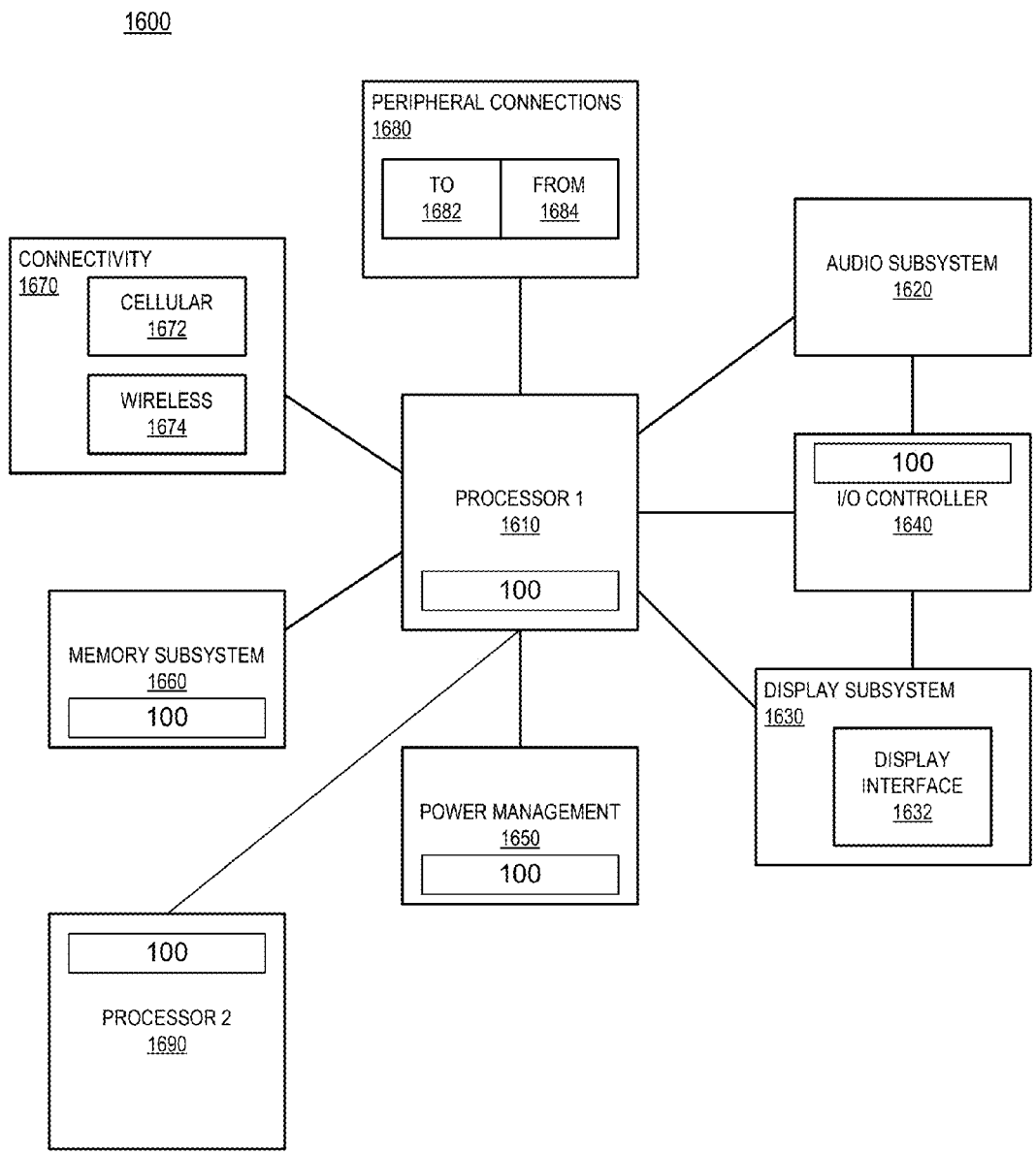
FIG. 7 is a smart device or a computer system or an SoC (system-on-chip) including VLD with high voltage protection circuit of FIG. 1, according to one embodiment of the disclosure.

FIG. 7 is a smart device or a computer system or an SoC (system-on-chip) including VLD with high voltage protection circuit of FIGS. 1-3, according to one embodiment of the disclosure. It is pointed out that those elements of FIG. 7 having the same reference numbers (or names) as the elements of any other figure can operate or function in any manner similar to that described, but are not limited to such.

FIG. 7 illustrates a block diagram of an embodiment of a mobile device in which flat surface interface connectors could be used. In one embodiment, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In one embodiment, computing device 1600 includes a first processor 1610 with circuit 100, according to the embodiments discussed. Other blocks of the computing device 1600 may also include circuit 100. The various embodiments of the present disclosure may also comprise a network interface within 1670 such as a wireless interface so that a system embodiment may be incorporated into a wireless device, for example, cell phone or personal digital assistant.

In one embodiment, processor 1610 (and processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device 1600. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus comprises: a voltage level detector to monitor a first power supply node; and a voltage level protector, coupled to the voltage level detector, to protect the voltage level detector from receiving a power supply on the first power supply node above a pre-defined threshold voltage. In one embodiment, the voltage level protector comprises: a first p-type device coupled to a second power supply node, the second power supply node to receive a power supply higher than the power supply on the first power supply node; and a second p-type device coupled in series to the first p-type device, the second p-type further coupled to the first power supply node.

In one embodiment, the voltage level protector comprises: a third p-type device coupled to the second power supply node and to the first p-type device, the third p-type device to bias a terminal of the first p-type device. In one embodiment, the voltage level protector comprises: a first n-type device coupled in series to the third p-type device, the first n-type device coupled to the first p-type device. In one embodiment, the first n-type device and third p-type device are biased by a node coupled to a third power supply different from the first and second power supplies.

In one embodiment, the second p-type device is controlled by a signal indicating whether the voltage level protector is to protect the voltage level detector from receiving the power supply on the first power supply node above a pre-defined threshold voltage. In one embodiment, the voltage level protector comprises a second n-type device coupled to the first n-type device and to a ground node.

In one embodiment, the voltage level detector comprises: a first comparator with a first input coupled to a first stack of devices and a first resistor, and a second input coupled to a second stack of devices and a second resistor, wherein the first resistor is coupled to ground and the first stack of devices, and wherein the first stack of devices is coupled to the first power supply node. In one embodiment, the second resistor is coupled to the first power supply node and to the second stack of devices.

In one embodiment, the first input of the first comparator is a negative terminal of the first comparator, and wherein the second input of the first comparator is a positive terminal of the first compactor. In one embodiment, the voltage level detector comprises: a second comparator with a first input coupled to the second stack of devices and the second resistor, and a second input coupled to a third stack of devices and a third resistor, wherein the third resistor is coupled to ground and the third stack of devices, and wherein the third stack of devices is coupled to the first power supply node.

In one embodiment, the first input of the second comparator is a negative terminal of the second comparator, and wherein the second input of the second comparator is a positive terminal of the second compactor.

In another example, a method comprises: monitoring a voltage level of a power supply node to determine whether the voltage level is above or below a threshold; and disabling a fuse array when it is determined that the voltage level is above or below the threshold. In one embodiment, the method further comprises sensing the fuse array according to the monitored voltage level.

In one embodiment, a system comprises: a memory; a wireless interface; and a processor, coupled to the memory, and operable to communicate with other devices using the wireless interface, the processor including an in-filed programmable fuse array and apparatus as discussed herein. In one embodiment, the system comprises a display unit to display data processed by the processor. In one embodiment, the display unit is a touch screen.

In another example, a voltage level protector is provided which protects a first power supply node from receiving a power supply above a pre-defined threshold voltage. In one embodiment, the voltage level protector comprises: a first p-type device coupled to a second power supply node, the second power supply node to receive a power supply higher than the power supply on the first power supply node; and a second p-type device coupled in series to the first p-type device, the second p-type further coupled to the first power supply node, which is for coupling to a voltage level detector.

In one embodiment, the voltage level protector further comprises: a third p-type device coupled to the second power supply node and to the first p-type device, the third p-type device to bias a terminal of the first p-type device. In one embodiment, the voltage level protector further comprises: a first n-type device coupled in series to the third p-type device, the first n-type device coupled to the first p-type device. In one embodiment, the first n-type device and third p-type device are biased by a node coupled to a third power supply different from the first and second power supplies.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:
1. An apparatus comprising:
a voltage level detector to monitor a first power supply node for protecting the apparatus against over-voltage and under-voltage power supply conditions, wherein the voltage level detector asserts an over-voltage signal when the voltage of the first power supply node exceeds an over-voltage threshold, and the voltage level detector asserts an under-voltage signal when the voltage of the first power supply node falls below an under-voltage; and
a voltage level protector, coupled to the voltage level detector, to protect the voltage level detector from receiving a power supply on the first power supply node above a pre-defined threshold voltage,
wherein the voltage level detector comprises a first comparator with a first input coupled to a first terminal between a first stack of devices and a first resistor, and a second input coupled to a second terminal between a second stack of devices and a second resistor, wherein the first resistor is coupled to ground and the first stack of devices, and wherein the first stack of devices is coupled to the first power supply node.

2. The apparatus of claim 1, wherein the voltage level protector comprises:
a first p-type device coupled to a second power supply node, the second power supply node to receive a power supply higher than the power supply on the first power supply node; and
a second p-type device coupled in series to the first p-type device, the second p-type further coupled to the first power supply node.

3. The apparatus of claim 2, wherein the voltage level protector comprises:
a third p-type device coupled to the second power supply node and to the first p-type device, the third p-type device to bias a terminal of the first p-type device.

4. The apparatus of claim 3, wherein the voltage level protector comprises:
a first n-type device coupled in series to the third p-type device, the first n-type device coupled to the first p-type device.

5. The apparatus of claim 4, wherein the first n-type device and third p-type device are biased by a node coupled to a third power supply different from the first and second power supplies.

6. The apparatus of claim 5, wherein the second p-type device is controlled by a signal indicating whether the voltage level protector is to protect the voltage level detector from receiving the power supply on the first power supply node above a pre-defined threshold voltage.

7. The apparatus of claim 4, wherein the voltage level protector comprises a second n-type device coupled to the first n-type device and to a ground node.

8. The apparatus of claim 1, wherein the second resistor is coupled to the first power supply node and to the second stack of devices.

9. The apparatus of claim 1, wherein the first input of the first comparator is a negative terminal of the first comparator, and wherein the second input of the first comparator is a positive terminal of the first compactor.

10. The apparatus of claim 1, wherein the voltage level detector comprises:
a second comparator with a first input coupled to the second stack of devices and the second resistor, and a second input coupled to a third stack of devices and a third resistor, wherein the third resistor is coupled to ground and the third stack of devices, and wherein the third stack of devices is coupled to the first power supply node.

11. The apparatus of claim 10, wherein the first input of the second comparator is a negative terminal of the second comparator, and wherein the second input of the second comparator is a positive terminal of the second compactor.

12. A system comprising:
a memory;
a wireless interface; and
a processor, coupled to the memory, and operable to communicate with other devices using the wireless interface, the processor including an in-field programmable fuse array and an apparatus which comprises:
a voltage level detector to monitor a first power supply node for protecting the apparatus against over-voltage and under-voltage power supply conditions, wherein the voltage level detector asserts an over-voltage signal when the voltage of the first power supply node exceeds an over-voltage threshold, and the voltage level detector asserts an under-voltage signal when the voltage of the first power supply node falls below an under-voltage threshold; and
a voltage level protector, coupled to the voltage level detector, to protect the voltage level detector from receiving a power supply on the first power supply node above a pre-defined threshold voltage,
wherein the voltage level detector comprises a first comparator with a first input coupled to a first terminal between a first stack of devices and a first resistor, and a second input coupled to a second terminal between a second stack of devices and a second resistor, wherein the first resistor is coupled to ground and the first stack of devices, and wherein the first stack of devices is coupled to the first power supply node.

13. The system of claim 12 further comprising a display unit to display data processed by the processor.

14. The system of claim 13, wherein the display unit is a touch screen.

15. The system of claim 12, wherein the second resistor is coupled to the first power supply node and to the second stack of devices.

16. The system of claim 12, wherein the first input of the first comparator is a negative terminal of the first comparator, and wherein the second input of the first comparator is a positive terminal of the first compactor.

17. The system of claim 12, wherein the voltage level detector comprises: a second comparator with a first input coupled to the second stack of devices and the second resistor, and a second input coupled to a third stack of devices and a third resistor, wherein the third resistor is coupled to ground and the third stack of devices, and wherein the third stack of devices is coupled to the first power supply node.

18. The system of claim 17, wherein the first input of the second comparator is a negative terminal of the second comparator, and wherein the second input of the second comparator is a positive terminal of the second compactor.

* * * * *